United States Patent
Kwon et al.

(10) Patent No.: US 11,493,848 B2
(45) Date of Patent: *Nov. 8, 2022

(54) RESIST UNDERLAYER COMPOSITION, AND METHOD OF FORMING PATTERNS USING THE COMPOSITION

(71) Applicant: SAMSUNG SDI CO., LTD., Yongin-si (KR)

(72) Inventors: Soonhyung Kwon, Suwon-si (KR); Shinhyo Bae, Suwon-si (KR); Hyeon Park, Suwon-si (KR); Jaeyeol Baek, Suwon-si (KR); Beomjun Joo, Suwon-si (KR); Yoojeong Choi, Suwon-si (KR); Kwen-Woo Han, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 1014 days.

This patent is subject to a terminal disclaimer.

(21) Appl. No.: 16/174,524

(22) Filed: Oct. 30, 2018

(65) Prior Publication Data

US 2019/0129307 A1 May 2, 2019

(30) Foreign Application Priority Data

Nov. 1, 2017 (KR) .................. 10-2017-0144735

(51) Int. Cl.
| | |
|---|---|
| G03F 7/11 | (2006.01) |
| G03F 7/09 | (2006.01) |
| H01L 21/027 | (2006.01) |
| C08G 12/34 | (2006.01) |
| C09D 161/30 | (2006.01) |
| H01L 21/311 | (2006.01) |
| G03F 7/16 | (2006.01) |
| G03F 7/20 | (2006.01) |
| G03F 7/30 | (2006.01) |

(52) U.S. Cl.
CPC .......... *G03F 7/11* (2013.01); *C08G 12/34* (2013.01); *C09D 161/30* (2013.01); *G03F 7/091* (2013.01); *G03F 7/094* (2013.01); *G03F 7/16* (2013.01); *G03F 7/168* (2013.01); *G03F 7/2006* (2013.01); *G03F 7/30* (2013.01); *H01L 21/0274* (2013.01); *H01L 21/31144* (2013.01)

(58) Field of Classification Search
None
See application file for complete search history.

(56) References Cited

U.S. PATENT DOCUMENTS

| | | | | |
|---|---|---|---|---|
| 3,660,088 | A * | 5/1972 | Lundsager | H01L 21/00 430/326 |
| 10,732,504 | B2 * | 8/2020 | Bae | G03F 7/094 |
| 2011/0319559 | A1 * | 12/2011 | Kania | C08G 75/02 524/609 |
| 2014/0227887 | A1 | 8/2014 | Kim et al. | |
| 2015/0017791 | A1 * | 1/2015 | Ohashi | H01J 37/3171 438/514 |

FOREIGN PATENT DOCUMENTS

| | | |
|---|---|---|
| CN | 104788598 A | 7/2015 |
| EP | 0 213 701 A1 | 3/1987 |
| KR | 10-2009-0082191 A | 7/2009 |
| KR | 1020140055050 | 5/2014 |
| KR | 1020140060331 | 5/2014 |
| KR | 10-1566532 B1 | 10/2015 |
| KR | 10-2016-0040521 A | 4/2016 |
| KR | 10-2016-0102175 A | 8/2016 |
| KR | 1020160123950 | 10/2016 |
| KR | 10-2018-0090640 A | 8/2018 |
| TW | 201346451 | 11/2013 |
| TW | 201518867 | 5/2015 |
| TW | 201704279 A | 2/2017 |
| WO | WO 2016/208472 A1 | 12/2016 |

OTHER PUBLICATIONS

Taiwanese Office Action dated Aug. 28, 2019.

* cited by examiner

*Primary Examiner* — Daborah Chacko-Davis
(74) *Attorney, Agent, or Firm* — Lee IP Law, P.C.

(57) ABSTRACT

A resist underlayer composition and a method of forming patterns, the composition including a solvent; and a polymer that includes a structural unit represented by Chemical Formula 1 and a structural unit represented by Chemical Formula 2,

[Chemical Formula 1]

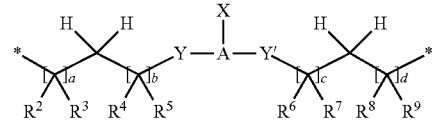

[Chemical Formula 2]

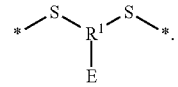

17 Claims, 3 Drawing Sheets

RESIST UNDERLAYER COMPOSITION, AND METHOD OF FORMING PATTERNS USING THE COMPOSITION

CROSS-REFERENCE TO RELATED APPLICATION

Korean Patent Application No. 10-2017-0144735, filed on Nov. 1, 2017, in the Korean Intellectual Property Office, and entitled: "Resist Underlayer Composition, and Method of Forming Patterns Using the Composition," is incorporated by reference herein in its entirety.

BACKGROUND

1. Field

Embodiments relate to a resist underlayer composition and a method of forming patterns using the same.

2. Description of the Related Art

Recently, the semiconductor industry has developed to an ultra-fine technique having a pattern of several to several tens nanometer size. Such ultrafine technique may utilize effective lithographic techniques.

Exposure performed during formation of the photoresist pattern may be a consideration for obtaining a photoresist image with a high resolution.

SUMMARY

The embodiments may be realized by providing a resist underlayer composition including a solvent; and a polymer that includes a structural unit represented by Chemical Formula 1 and a structural unit represented by Chemical Formula 2,

[Chemical Formula 1]

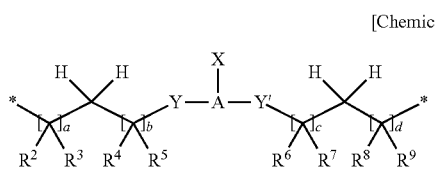

wherein, in Chemical Formula 1, A is a substituted or unsubstituted C1 to C30 alkylene group, a substituted or unsubstituted C1 to C30 heteroalkylene group, a substituted or unsubstituted C3 to C30 cyclo alkylene group, a substituted or unsubstituted C2 to C30 heterocyclo alkylene group, a substituted or unsubstituted C6 to C30 arylene group, a substituted or unsubstituted C2 to C30 heteroarylene group, or a combination thereof, X is a group including an electrophile, Y and Y' are each independently a single bond, oxygen, carbonyl, —(CH$_2$)O—, —(CH$_2$)S—, —(CH$_2$)NH—, or a combination thereof, R$^2$ to R$^9$ are independently hydrogen, a hydroxy group, a halogen, a substituted or unsubstituted C1 to C10 alkoxy group, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C1 to C30 heteroalkyl group, a substituted or unsubstituted C2 to C30 heteroaryl group, or a combination thereof, a, b, c, and d are independently an integer of 0 to 100, a sum of a and b being 1 to 99, and a sum of c and d being 1 to 99, and * is a linking point,

[Chemical Formula 2]

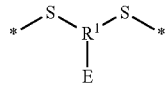

wherein, in Chemical Formula 2, R$^1$ is a substituted or unsubstituted C1 to C30 alkylene group, a substituted or unsubstituted C1 to C30 heteroalkylene group, a substituted or unsubstituted C3 to C30 cycloalkylene group, a substituted or unsubstituted C6 to C30 arylene group, a substituted or unsubstituted C2 to C30 heteroarylene group, —((C$_m$H$_{2m}$)O)$_n$—, in which m and n are each independently an integer of 1 to 10, or a combination thereof, E is a group including a nucleophile, and * is a linking point.

In Chemical Formula 2, the moiety

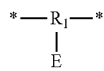

may be a moiety represented by Chemical Formula 2-I:

[Chemical Formula 2-I]

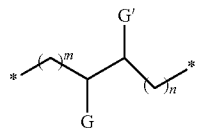

wherein, in Chemical Formula 2-I, G and G' are each independently a group including a nucleophile, m and n are each independently an integer of 0 to 10, and * is a linking point.

In Chemical Formula 1, A may be a substituted or unsubstituted C1 to C30 heteroalkylene group, a substituted or unsubstituted C2 to C30 heterocycloalkylene group, a substituted or unsubstituted C2 to C30 heteroarylene group, or a combination thereof.

X of Chemical Formula 1 may be a group including an electrophile having, at a terminal end thereof, an epoxy group, a C1 to C6 alkoxy group, R—(C=O)—, in which R is hydrogen or a C1 to C10 alkyl group, R'O—(C=O)—, in which R' is a C1 to C10 alkyl group, or a halogen.

X of Chemical Formula 1 may be bonded to at least one of a heteroatom or a carbon atom of A.

The moiety

of Chemical Formula 1 may be a moiety represented by one of Chemical Formulae 1-a to 1-c:

[Chemical Formula 1-a]

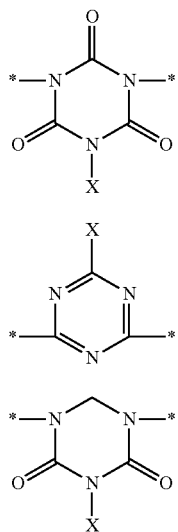

[Chemical Formula 1-b]

[Chemical Formula 1-c]

wherein, in Chemical Formulae 1-a to 1-c, X is defined the same as X of Chemical Formula 1.

X may be a group represented by Chemical Formula 1-II:

*—$(CH_2)_o$-$(Q)_p$-$(CH_2)_q$—$R^a$    [Chemical Formula 1-II]

wherein, in Chemical Formula 1-II, o, p, and q are each independently an integer of 0 to 10, Q is —O—, —S—, —(C=O)—, —(C=O)O—, —$CH_2NH$—, —CONH—, —NH—, or —$(SO_2)$—, and $R^a$ is a group including an electrophile having a C1 to C10 alkyl group, an epoxy group, a C1 to C6 alkoxy group, R—(C=O)—, in which R is hydrogen or a C1 to C10 alkyl group, R'O—(C=O)—, in which R' is hydrogen or a C1 to C10 alkyl group, or a halogen, or a combination thereof.

E may include a hydroxy group (—OH), an amino group (—$NH_2$), a carboxyl group (—COOH), an amide group (—$CONH_2$), or a thiol group (—SH).

G and G' may each independently include a hydroxy group (—OH), an amino group (—$NH_2$), a carboxyl group (—COOH), an amide group (—$CONH_2$), or a thiol group (—SH).

The polymer may include a structural unit represented by one of Chemical Formula 3 to Chemical Formula 11:

[Chemical Formula 3]

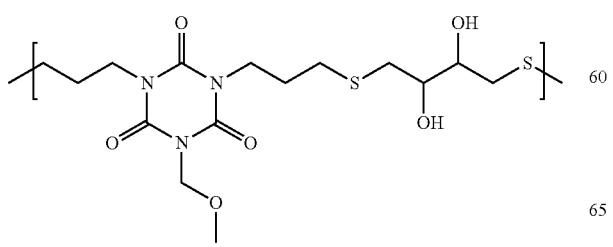

[Chemical Formula 4]

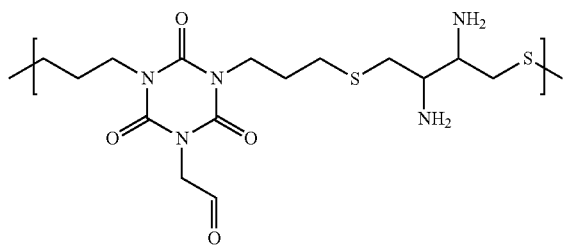

[Chemical Formula 5]

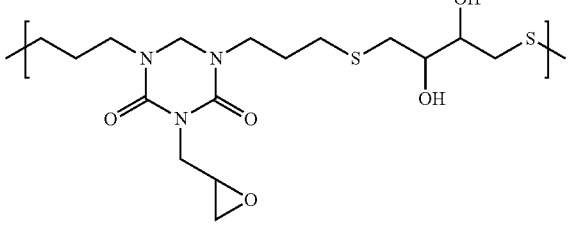

[Chemical Formula 6]

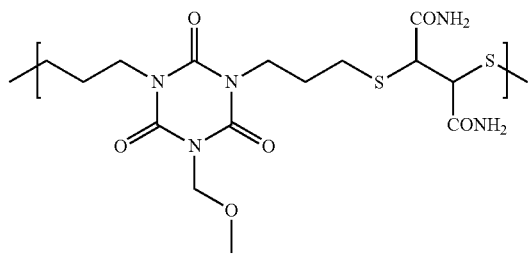

[Chemical Formula 7]

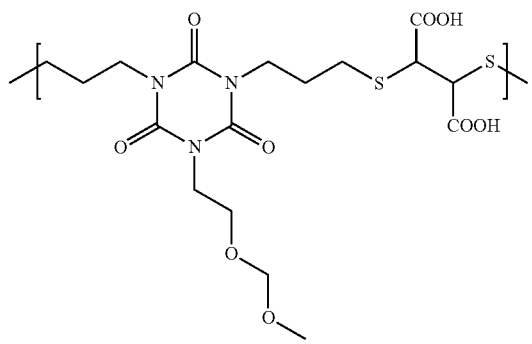

[Chemical Formula 8]

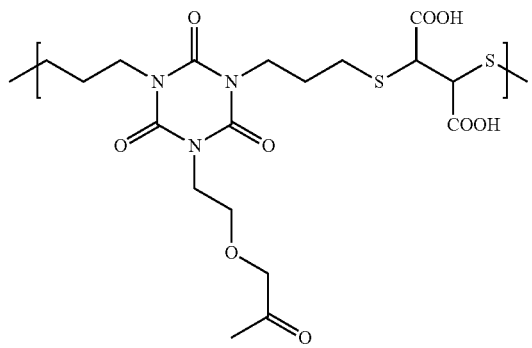

-continued

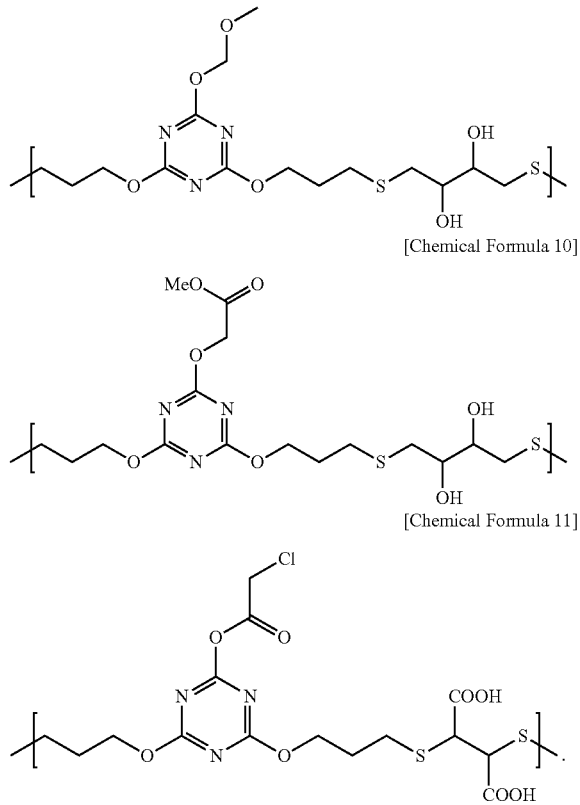

[Chemical Formula 9]

[Chemical Formula 10]

[Chemical Formula 11]

The polymer may have a weight average molecular weight of about 1,000 to about 100,000.

The polymer may be included in an amount of about 0.1 wt % to about 50 wt %, based on a total weight of the resist underlayer composition.

The resist underlayer composition may further include an acryl resin, an epoxy resin, a novolac resin, a glycoluril resin, or a melamine resin.

The resist underlayer composition may further include a surfactant, a thermal acid generator, a plasticizer, or a combination thereof.

The embodiments may be realized by providing a method of forming patterns, the method including forming an etching subject layer on a substrate, coating the resist underlayer composition according to an embodiment on the etching subject layer to form a resist underlayer, forming a photoresist pattern on the resist underlayer, and sequentially etching the resist underlayer and the etching subject layer using the photoresist pattern as an etching mask.

Forming the photoresist pattern may include forming a photoresist layer on the resist underlayer, exposing the photoresist layer, and developing the photoresist layer.

Forming the resist underlayer may further include heat-treating the coated resist underlayer composition at a temperature of about 100° C. to about 500° C.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
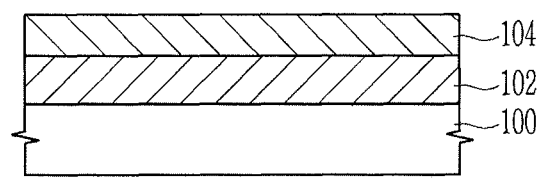
FIGS. 1 to 5 illustrate cross-sectional views of stages in a method of forming patterns using a resist underlayer composition according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. As used herein, the term "or" is not an exclusive term.

In the drawings, the thickness of layers, films, panels, regions, etc., may be exaggerated for clarity and like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, when a definition is not otherwise provided, 'substituted' refers to replacement of a hydrogen atom of a compound by a substituent selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a vinyl group, a C1 to C20 alkyl group, a C2 to C20 alkenyl group, a C2 to C20 alkynyl group, a C6 to C30 aryl group, a C7 to C30 arylalkyl group, a C6 to C30 allyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

As used herein, when a definition is not otherwise provided, the term 'hetero' refers to one including 1 to 3 heteroatoms selected from N, O, S, and P.

As used herein, when a definition is not otherwise provided, '*' refers to a linking point of a compound or a compound moiety.

Hereinafter, a resist underlayer composition according to an embodiment is described.

A resist underlayer composition according to an embodiment may include a polymer including a structural unit represented by Chemical Formula 1' and a structural unit represented by Chemical Formula 2, and a solvent.

[Chemical Formula 1']

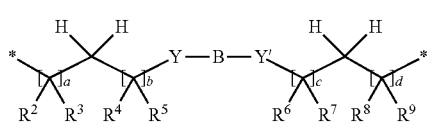

In Chemical Formula 1',

B is a divalent group represented by Chemical Formula 1-I, such that the structural unit is represented by Chemical Formula 1.

[Chemical Formula 1-I]

[Chemical Formula 1]

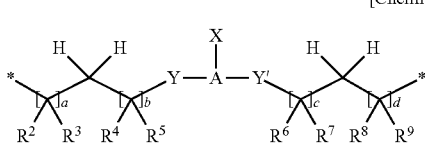

In Chemical Formula 1,

A may be or may include, e.g., a substituted or unsubstituted C1 to C30 alkylene group, a substituted or unsubstituted C1 to C30 heteroalkylene group, a substituted or unsubstituted C3 to C30 cyclo alkylene group, a substituted or unsubstituted C2 to C30 heterocyclo alkylene group, a substituted or unsubstituted C6 to C30 arylene group, a substituted or unsubstituted C2 to C30 heteroarylene group, or a combination thereof, X may be, e.g., a group including an electrophile, Y and Y' may each independently be, e.g., a single bond, oxygen, carbonyl, $-(CH_2)O-$, $-(CH_2)S-$, $-(CH_2)NH-$, or a combination thereof, $R^2$ to $R^9$ may each independently be or may include, e.g., hydrogen, a hydroxy group, a halogen, a substituted or unsubstituted C1 to C10 alkoxy group, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C1 to C30 heteroalkyl group, a substituted or unsubstituted C2 to C30 heteroaryl group, or a combination thereof, a, b, c, and d may each independently be, e.g., an integer of 0 to 100. In an implementation, a sum of a and b may be 1 or more (e.g., 1 to 99), and a sum of c and d may be 1 or more (e.g., 1 to 99).

* is a linking point;

[Chemical Formula 2]

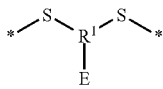

In Chemical Formula 2, $R^1$ may be or may include, e.g., a substituted or unsubstituted C1 to C30 alkylene group, a substituted or unsubstituted C1 to C30 heteroalkylene group, a substituted or unsubstituted C3 to C30 cycloalkylene group, a substituted or unsubstituted C6 to C30 arylene group, a substituted or unsubstituted C2 to C30 heteroarylene group, $-((C_mH_{2m})O)_n-$ (in which m and n are each independently an integer of 1 to 10), or a combination thereof, E is a group including a nucleophile, and

* is a linking point.

In Chemical Formula 1, A may be or may include, e.g., a substituted or unsubstituted C1 to C30 heteroalkylene group having at least one heteroatom, a substituted or unsubstituted C2 to C30 heterocycloalkylene group having at least one heteroatom, a substituted or unsubstituted C2 to C30 heteroarylene group having at least one heteroatom, or a combination thereof. In an implementation, the heteroatom may be a heteroatom having a binding valence of 3 or more, e.g., nitrogen (N). When the heteroatom is nitrogen, A may be 6-atom heterocyclic group (e.g., 6-membered ring) wherein at least one carbon is replaced by nitrogen. In an implementation, carbon that is unreplaced by nitrogen may be linked with other heteroatoms.

X of Chemical Formula 1-I may be an electrophile that is bindable with D of Chemical Formula 2 to form a cross-linking structure. For example, X may be a group including an electrophile and having, at a terminal end thereof, an epoxy group, C1 to C6 alkoxy group, $R-(C=O)-$ (in which R is hydrogen or a C1 to C10 alkyl group), $R'O-(C=O)-$ (in which R' is a C1 to C10 alkyl group), or a halogen. In an implementation, X may be bonded with a heteroatom or a carbon atom of A that is the substituted or unsubstituted C1 to C30 heteroalkylene group including at least one heteroatom, the substituted or unsubstituted C2 to C30 heterocyclo alkylene group including at least one heteroatom, the substituted or unsubstituted C2 to C30 heteroarylene group including at least one heteroatom, or combination thereof.

In an implementation, the moiety

of Chemical Formula 1 may be a moiety represented by one of Chemical Formulae 1-a to 1-c.

[Chemical Formula 1-a]

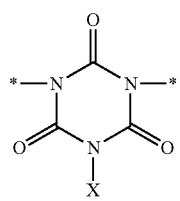

[Chemical Formula 1-b]

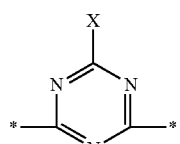

[Chemical Formula 1-c]

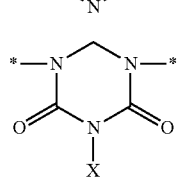

In Chemical Formulae 1-a to 1-c, X may be a group including an electrophile that is defined the same as X of Chemical Formula 1.

In an implementation, X of Chemical Formulae 1-a to 1-c may be a group including an electrophile having, at a terminal end thereof, an epoxy group, a C1 to C6 alkoxy group, $R-(C=O)-$ (in which R is hydrogen or a C1 to C10 alkyl group), $R'O-(C=O)-$ (in which R' is a C1 to C10 alkyl group), or a halogen.

In an implementation, X may be a group represented by Chemical Formula 1-II.

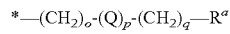 [Chemical Formula 1-II]

In Chemical Formula 1-II, o, p, and q may each independently be, e.g., an integer of 0 to 10, Q may be, e.g., —O—, —S—, —(C═O)—, —(C═O)O—, —CH$_2$NH—, —CONH—, —NH—, or —(SO$_2$)—, and R$^a$ may be, e.g., a group including an electrophile having a C1 to C10 alkyl group, an epoxy group, a C1 to C6 alkoxy group, R—(C═O)— (in which R is hydrogen or a C1 to C10 alkyl group), R'O—(C═O)— (in which R' is hydrogen, or a C1 to C10 alkyl group), or a halogen, or a combination thereof.

In an implementation, D of Chemical Formula 2 may be a nucleophile including unshared electron pairs and may bind with the electrophile represented by X to form a cross-linking structure. In an implementation, E may include, e.g., a hydroxy group (—OH), an amino group (—NH$_2$), a carboxyl group (—COOH), an amide group (—CONH$_2$), or a thiol group (—SH). In an implementation, E may be, e.g., a substituent that is bindable with an electrophile to form a cross-linking structure.

In an implementation, in Chemical Formula 2, a moiety represented by

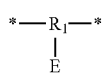

may be represented by Chemical Formula 2-I.

[Chemical Formula 2-I]

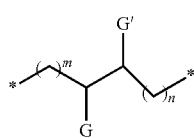

In Chemical Formula 2-I,

G and G' may each independently be a group including a nucleophile, m and n may each independently be an integer of 0 to 10, and

* is a linking point.

G and G' may be the same as D described above, but are separately marked to show each substitution for neighboring carbons. Accordingly, G and G' may include a suitable substituent including unshared electron pairs like D and thus combining with X of Chemical Formula 1 to form a cross-linking structure. In an implementation, G and G' may each independently include, e.g., a hydroxy group (—OH), an amino group (—NH$_2$), a carboxyl group (—COOH), an amide group (—CONH$_2$), or a thiol group (—SH).

In an implementation, the polymer may include a structural unit represented by one of Chemical Formula 3 to Chemical Formula 11.

[Chemical Formula 3]

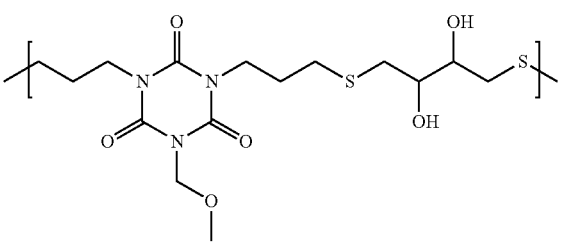

[Chemical Formula 4]

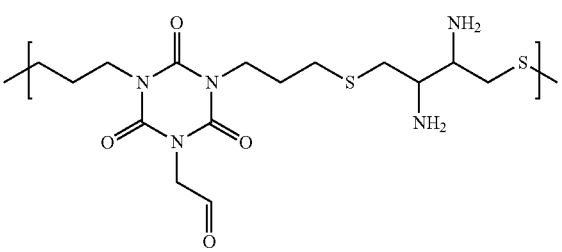

[Chemical Formula 5]

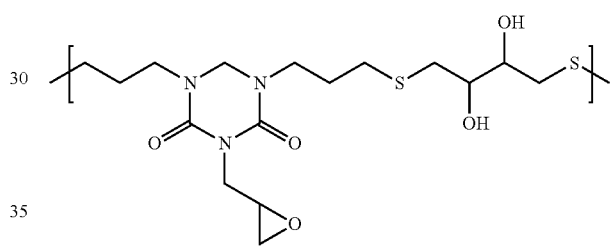

[Chemical Formula 6]

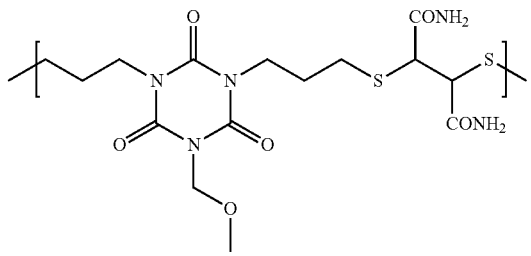

[Chemical Formula 7]

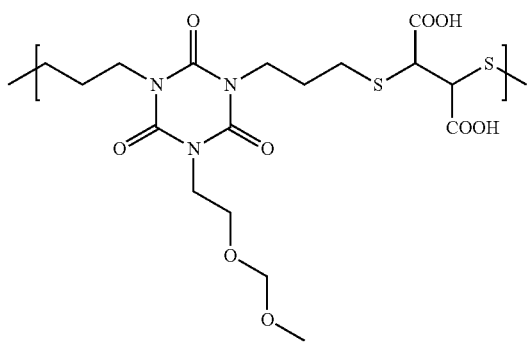

-continued

[Chemical Formula 8]

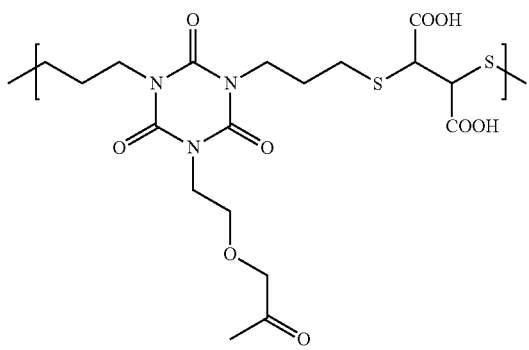

[Chemical Formula 9]

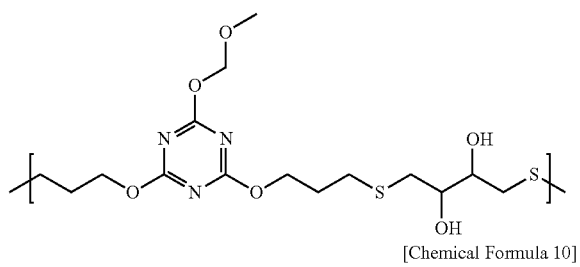

[Chemical Formula 10]

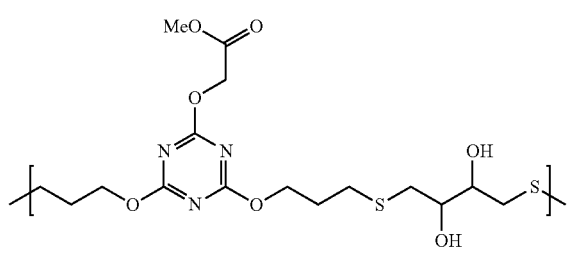

[Chemical Formula 11]

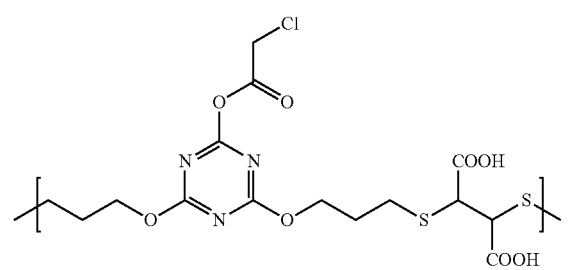

The polymer according to an embodiment may include both a structural unit including a nucleophile and a structural unit including an electrophile. Thus, the polymer may from a cross-linking structure between polymer chains without separately adding a cross-linking agent.

A cross-linking agent may be a compound having a low molecular weight, and in addition to the cross-linking agent, a low molecular compound such as a thermal acid generator may be included in a resist underlayer composition. When a low molecular weight material such as the cross-linking agent, the thermal acid generator, and the like is included in a composition, the low molecular weight compound could generate sublimable gas during a patterning process at a high temperature and thus could cause a defect on a semiconductor wafer and thereby deteriorate coating uniformity of the composition. Accordingly, addition of low molecular weight compounds to the composition should be minimized.

The photoresist underlayer composition according to an embodiment may include both the structural unit including the nucleophile and the structural unit including the electrophile in one polymer, wherein the electrophile and the nucleophile are cross-linkable between polymers without separately adding a cross-linking agent to the composition, and addition of the low molecular weight compounds (such as a cross-linking agent) to the photoresist underlayer composition may be minimized. Accordingly, the photoresist underlayer composition may decrease a defect rate caused by sublimation and/or gas generated by the low molecular weight compound during the high temperature manufacturing process, and thus may help prevent the deterioration of coating uniformity due to the sublimable gas.

In addition, the polymer may be stable in an organic solvent and heat, and when a resist underlayer composition including the polymer is, e.g., used as a photoresist underlayer material, a resist underlayer formed thereof may be minimized from delamination by the solvent or the heat during a process of forming a photoresist pattern or may minimize generation of a byproduct such as a chemical material and the like and a thickness loss by a photoresist solvent thereon.

In addition, the polymer includes sulfur (S) in a main chain and thus may realize a high refractive index and have a fast etch rate.

In addition, the polymer may have improved solubility and may form a resist underlayer having improved coating uniformity. The polymer may be used as a material for a resist underlayer, a uniform thin layer may not only be obtained without forming a pin-hole or a void and deteriorating a thickness distribution during a baking process, and improved gap-fill and planarization characteristics may also be obtained when a lower substrate (or a layer) has a step or is patterned.

The resist underlayer composition according to an embodiment may realize excellent coating uniformity and stability and a high refractive index and in addition, a fast etch-rate, and thus may be applied to an EUV (Extreme Ultraviolet) lithography process. The EUV lithography process uses light at a wavelength of about 10 nm to about 20 nm, e.g., a very short wavelength of about 13.5 nm, and thus may from an ultra-fine pattern having a width of less than or equal to about 20 nm and may form an ultrafine pattern.

In an implementation, the polymer may have a weight average molecular weight of, e.g., about 1,000 to about 100,000. For example, the polymer may have a weight average molecular weight of about 1,000 to about 50,000, or about 1,000 to about 20,000. When the polymer has a weight average molecular weight within the ranges, the amount of carbon and solubility in a solvent of the resist underlayer composition including the polymer may be optimized.

The solvent may be a suitable solvent having sufficient dissolubility or dispersibility or the polymer and may include, e.g., propylene glycol, propylene glycol diacetate, methoxy propanediol, diethylene glycol, diethylene glycol butylether, tri(ethylene glycol)monomethylether, propylene glycol monomethylether, propylene glycol monomethylether acetate, cyclohexanone, ethyllactate, gamma-butyrolactone, N,N-dimethyl formamide, N,N-dimethyl acetamide, methylpyrrolidone, methylpyrrolidinone, acetylacetone, or ethyl 3-ethoxypropionate.

The polymer may be included in an amount of, e.g., about 0.1 wt % to about 50 wt %, about 0.1 wt % to about 30 wt %, or about 0.1 wt % to about 15 wt %, based on a total weight of the resist underlayer composition. Within the ranges, a thickness, a surface roughness, and a planarization degree of a resist underlayer may be controlled.

In an implementation, the resist underlayer composition may further include at least one other polymer of, e.g., an acryl resin, an epoxy resin, a novolac resin, a glycoluril resin, or a melamine resin, in addition to the polymer including the structural unit represented by Chemical Formula 1 and the structural unit represented by Chemical Formula 2.

The resist underlayer composition may further include an additive of, e.g., a surfactant, a thermal acid generator, a plasticizer, or a combination thereof.

The surfactant may include, e.g., an alkylbenzene sulfonate salt, an alkylpyridinium salt, polyethylene glycol, a quaternary ammonium salt, and the like.

The thermal acid generator may be, e.g., an acidic compound such as p-toluene sulfonic acid, trifluoromethane sulfonic acid, pyridinium p-toluene sulfonic acid, salicylic acid, sulfosalicylic acid, citric acid, benzoic acid, hydroxybenzoic acid, naphthalene carbonic acid, and the like or/and 2,4,4,6-tetrabromocyclohexadienone, benzointosylate, 2-nitrobenzyltosylate, other organic sulfonic acid alkylester, and the like.

The additive may be included in an amount of about 0.001 to about 40 parts by weight, based on 100 parts by weight of the resist underlayer composition. Within the ranges, solubility may be improved while optical properties of the resist underlayer composition are not changed.

According to another embodiment, a resist underlayer manufactured using the resist underlayer composition is provided. The resist underlayer may be obtained by coating the resist underlayer composition on, e.g., a substrate, and then curing it through a heat treatment process. The resist underlayer may be, e.g., an anti-reflection coating.

Hereinafter, a method of forming patterns using the resist underlayer composition is described referring to FIGS. 1 to 5.

FIGS. 1 to 5 illustrate cross-sectional views of stages in a method of forming patterns using a resist underlayer composition according to an embodiment.

Referring to FIG. 1, a subject for etching is prepared. The etching subject may be a thin layer 102 formed on a semiconductor substrate 100. Hereinafter, the etching subject is described as the thin layer 102. An entire surface of the thin layer 102 may be washed to remove impurities and the like remaining thereon. The thin layer 102 may be, e.g., a silicon nitride layer, a polysilicon layer, or a silicon oxide layer.

Subsequently, the resist underlayer composition including the polymer including the moieties represented by Chemical Formulae 1 and 2, an acryl resin including a hydroxy group, and a solvent may be spin-coated on the surface of the washed thin layer 102.

Then, the coated composition may be dried and baked to form a resist underlayer 104 on the thin layer 102. The baking may be performed at about 100° C. to about 500° C., e.g., about 100° C. to about 300° C. The resist underlayer composition is described above in detail.

Figure 2:
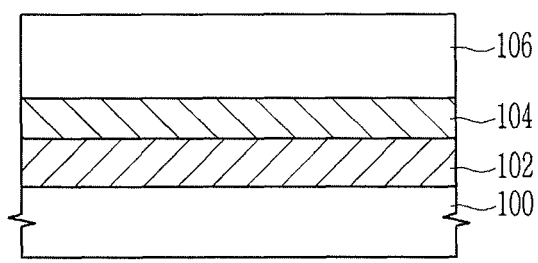

Referring to FIG. 2, a photoresist layer 106 may be formed by coating a photoresist on the resist underlayer 104.

Examples of the photoresist may be a positive-type photoresist containing a naphthoquinone diazide compound and a novolac resin, a chemically-amplified positive photoresist containing an acid generator capable of dissociating acid through exposure, a compound decomposed under a presence of the acid and having increased dissolubility in an alkali aqueous solution, and an alkali soluble resin, a chemically-amplified positive-type photoresist containing an alkali-soluble resin capable of applying a resin increasing dissolubility in an alkali aqueous solution, and the like.

Subsequently, the substrate 100 having the photoresist layer 106 may be primarily baked. The primary baking may be performed at about 90° C. to about 120° C.

Figure 3:
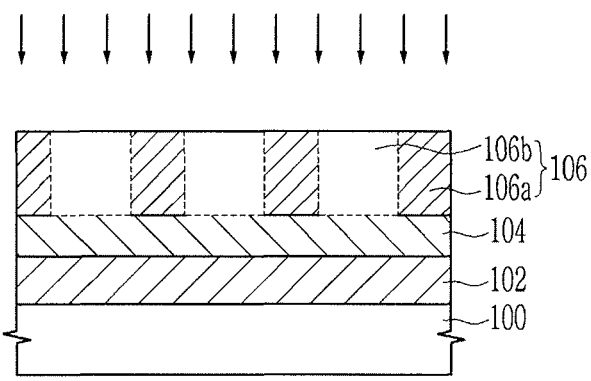

Referring to FIG. 3, the photoresist layer 106 may be selectively exposed.

Exposure of the photoresist layer 106 may be, e.g., performed by positioning an exposure mask having a predetermined pattern on a mask stage of an exposure apparatus and aligning the exposure mask on the photoresist layer 106. Subsequently, a predetermined region of the photoresist layer 106 formed on the substrate 100 selectively reacts with light passing the exposure mask by radiating light into the exposure mask.

Examples of the light used during the exposure may include light having a short wavelength of an activated radiation i-line having a wavelength of 365 nm, KrF excimer laser having a wavelength of 248 nm, ArF excimer laser having a wavelength of 193 nm, and the like and may be light having high energy wavelength of EUV (extreme ultraviolet; wavelength of 13.5 nm), E-Beam (electron beam), and the like.

An exposed region 106b of the photoresist layer 106 may be relatively hydrophilic compared with a non-exposed region 106a of the photoresist layer 106. Accordingly, the exposed region 106b and non-exposed region 106a of the photoresist layer 106 may have different solubility each other.

Subsequently, the substrate 100 may be secondarily baked. The secondary baking may be performed at about 90° C. to about 150° C. The exposed region 106b of the photoresist layer becomes easily soluble in a predetermined solvent due to the secondary baking.

Figure 4:
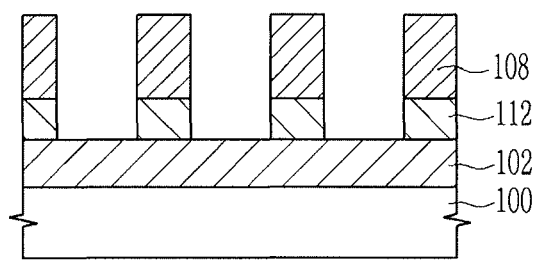

Referring to FIG. 4, the exposed region 106b of the photoresist layer may be dissolved and removed by a developing solution to form a photoresist pattern 108. For example, the exposed region 106b of the photoresist layer may be dissolved and removed by using a developing solution such as tetra-methyl ammonium hydroxide (TMAH) and the like to finish the photoresist pattern 108.

Subsequently, the photoresist pattern 108 may be used as an etching mask to etch the resist underlayer 104. Through the etching, an organic layer pattern 112 may be formed. The etching may include, e.g., dry etching using etching gas, and the etching gas may include, e.g., $CHF_3$, $CF_4$, $Cl_2$, $BCl_3$, or a mixed gas thereof. As described above, a resist underlayer formed by the resist underlayer composition according to an embodiment may have a fast etch rate, an etching process may be smoothly performed in a short time.

Figure 5:
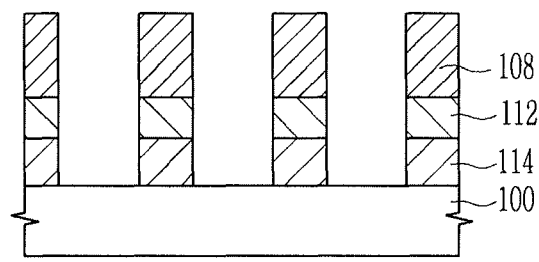

Referring to FIG. 5, the photoresist pattern 108 may be used as an etching mask to etch the exposed thin layer 102. As a result, the thin layer is formed into a thin layer pattern 114. During the exposure process, the thin layer pattern 114 formed by an exposure process using a light source having of a short wavelength such as activated radiation i-line (365 nm), KrF excimer laser (wavelength of 248 nm), ArF excimer laser (wavelength of 193 nm) and the like may have a width of scores of nanometers to hundreds of nanometers, and the thin layer pattern 114 formed by an exposure process using an EUV light source may have a width of less than or equal to about 20 nm.

Hereinafter, the embodiments are described in more detail through examples regarding synthesis of the polymer and preparation of a resist underlayer composition including the same. However, the embodiments are not technically not restricted by the following examples.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

SYNTHESIS EXAMPLES

Synthesis Example 1

1,3-diallyl-5-(methoxymethyl)isocyanurate (101.3 g), 1,4-dithiothreitol (61.7 g), AIBN (1.31 g), and dimethyl formamide (108 g) were put in a 500 ml 2-necked round flask, and a condenser was connected thereto. The obtained mixture was heated up to 80° C., reacted for 2.5 hours, and cooled down to ambient temperature. Subsequently, the reaction solution was moved to a 1 L wide mouth bottle, washed three times with hexane, and subsequently washed with purified water. Then, a resin in a gum state obtained therefrom was completely dissolved by using 80 g of THF and then, slowly added in a dropwise fashion to 700 g of toluene while stirred. After pouring a solvent away therefrom, a solvent still remaining there was removed with a vacuum pump to obtain a polymer including a structural unit represented by Chemical Formula 3 (Mw=3,000).

[Chemical Formula 3]

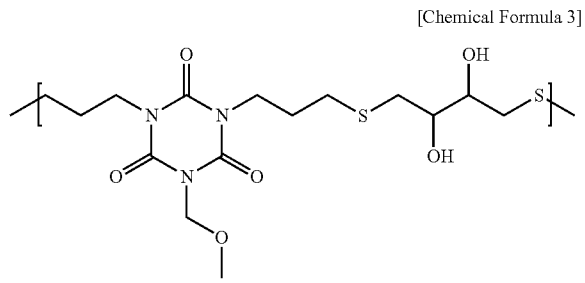

Synthesis Example 2

1,3-diallyl-5-(2-oxoethyl)isocyanurate (100.4 g), 1,4-dithiothreitol (61.7 g), AIBN (1.31 g), and dimethyl formamide (108 g) were put in a 500 ml 2-necked round flask, and a condenser was connected thereto. The obtained mixture was heated up to 80° C., reacted for 2.5 hour, and cooled down to ambient temperature. Subsequently, the reaction solution was moved to a 1 L wide mouth bottle, washed three times with hexane, and subsequently, washed with purified water. A resin in a gum state obtained therefrom was completely dissolved in 80 g of THF and then, slowly added in a dropwise fashion to 700 g of toluene. After pouring away a solvent therefrom, a solvent still remaining there was removed with a vacuum pump to obtain a polymer including a structural unit represented by Chemical Formula 4 (Mw=5,000).

[Chemical Formula 4]

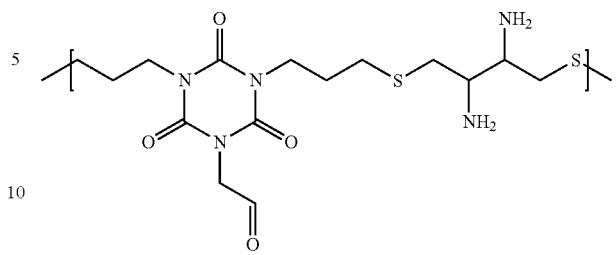

Synthesis Example 3

1,3-diallyl-5-(2,3-epoxypropyl) 1,3,5-triazinane-2,4-dione (112.0 g), 1,4-dithiothreitol (61.7 g), AIBN (1.31 g), and dimethyl formamide (111 g) were put in a 500 ml 2-necked round flask, and a condenser was connected thereto. The obtained mixture was heated to 80° C., reacted for 2.5 hours, and then, cooled down to ambient temperature. Subsequently, the reaction solution was moved to a 1 L wide mouth bottle, washed three times with hexane, and subsequently, washed with purified water. Subsequently, a resin in a gum state obtained therefrom was completely dissolved in 80 g of THF and then, slowly added in a dropwise fashion to 700 g of toluene, while stirred. After pouring away a solvent therefrom, a solvent still remaining there was removed with a vacuum pump to obtain a polymer including a structural unit represented by Chemical Formula 5 (Mw=4,000).

[Chemical Formula 5]

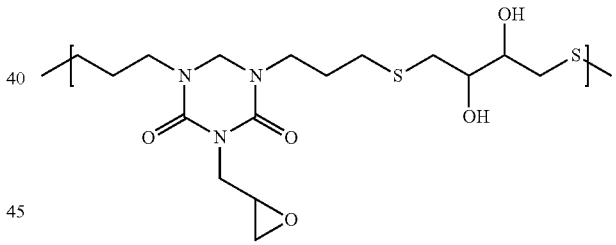

Synthesis Example 4

1,3-diallyl-5-(methoxymethyl)isocyanurate (101.3 g), 2,3-disulfanylbutanediamide (72.1 g), AIBN (1.31 g), and dimethyl formamide (123 g) were put in a 500 ml 2-necked round flask, and a condenser was connected thereto. The obtained mixture was heated up to 80° C. and reacted for 2.5 hours, and then, the reaction solution was cooled down to ambient temperature. Subsequently, the reaction solution was moved to a 1 L wide mouth bottle, washed three times with hexane, and subsequently, washed with purified water. Subsequently, a resin in a gum state obtained therefrom was completely dissolved in 80 g of THF and then, slowly added in a dropwise fashion to 700 g of toluene, while stirred. After pouring a solvent therefrom, a solvent still remaining there was removed with a vacuum pump to obtain a polymer including a structural unit represented by Chemical Formula 6 (Mw=5,000).

[Chemical Formula 6]

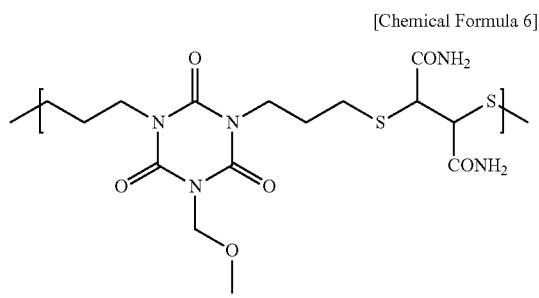

Synthesis Example 5

1,3-diallyl-5-(methoxymethoxyethyl)isocyanurate (118.9 g), 2,3-dimercaptosuccinic acid (72.9 g), AIBN (1.31 g), and dimethyl formamide (135 g) were put in a 500 ml 2-necked round flask, and a condenser was connected thereto. The obtained mixture was heated up to 80° C. and reacted for 2.5 hours, and the reaction solution was cooled down to ambient temperature. Subsequently, the reaction solution was moved to a 1 L wide mouth bottle, washed three times with hexane, and subsequently, washed with purified water. Then, a resin in a gum state obtained therefrom was completely dissolved in 80 g of THF and slowly added in a dropwise fashion to 700 g of toluene. After pouring away a solvent therefrom, a solvent still remaining there was removed with a vacuum pump to obtain a polymer including a structural unit represented by Chemical Formula 7 (Mw=6,000).

[Chemical Formula 7]

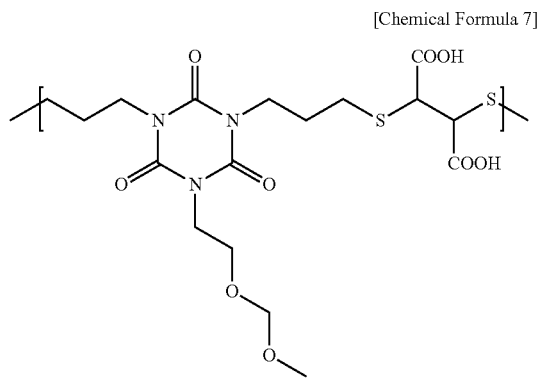

Synthesis Example 6

1,3-diallyl-5-(2-(2-oxopropoxy)ethyl)isocyanurate (123.7 g), 2,3-dimercaptosuccinic acid (72.9 g), AIBN (1.31 g), and dimethyl formamide (139 g) were put in a 500 ml 2-necked round flask, and a condenser was connected thereto. The obtained mixture was heated up to 80° C. and reacted for 2.5 hours, and the reaction solution was cooled down to ambient temperature. Then, the reaction solution was moved to a 1 L wide mouth bottle, washed three times with hexane, and subsequently, washed with purified water. Subsequently, a resin in a gum state obtained therefrom was completely dissolved in 80 g of THF and then, slowly added to 700 g of toluene, while stirred. After pouring away a solvent, a solvent still remaining there was removed with a vacuum pump to obtain a polymer including a structural unit represented by Chemical Formula 8 (Mw=6,000).

[Chemical Formula 8]

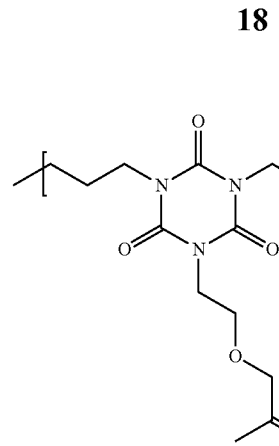

Synthesis Example 7

2,4-diallyloxy-6-methoxymethoxy-1,3,5-triazine (101.3 g), 1,4-dithiothreitol (61.7 g), AIBN (1.31 g), and dimethyl formamide (108 g) were put in a 500 ml 2-necked round flask, and a condenser was connected thereto. The obtained mixture was heated up to 80° C. and reacted for 2.5 hours, and the reaction solution was cooled down to ambient temperature. Subsequently, the reaction solution was moved to a 1 L wide mouth bottle, washed three times with hexane, and subsequently, washed with purified water. Then, a resin in a gum state obtained therefrom was completely dissolved in 80 g of THF and slowly added in a dropwise fashion 700 g of toluene, while stirred. After pouring away a solvent therefrom, a solvent still remaining there was removed with a vacuum pump to obtain a polymer including a structural unit represented by Chemical Formula 9 (Mw=5,000).

[Chemical Formula 9]

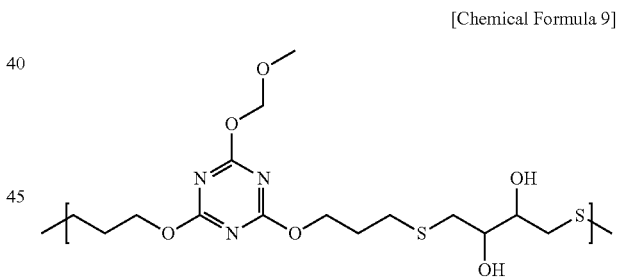

Synthesis Example 8

2,4-diallyloxy-6-methoxymethoxy-1,3,5-triazine (112.4 g), 1,4-dithiothreitol (61.7 g), AIBN (1.31 g), and dimethyl formamide (131 g) were put in a 500 ml 2-necked round flask, and a condenser was connected thereto. The obtained mixture was heated up to 80° C. and reacted for 2.5 hours, and the reaction solution was cooled down to ambient temperature. Subsequently, the reaction solution was moved to a 1 L wide mouth bottle, washed three times with hexane, and subsequently, washed with purified water. Then, a resin in a gum state obtained therefrom was completely dissolved in 80 g of THF and slowly added in a dropwise fashion 700 g of toluene, while stirred. After pouring away a solvent therefrom, a solvent still remaining there was removed with a vacuum pump to obtain a polymer including a structural unit represented by Chemical Formula 10 (Mw=6,000).

[Chemical Formula 10]

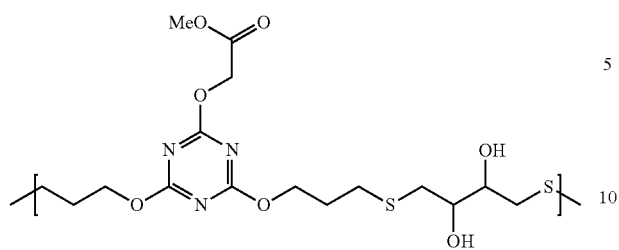

[Chemical Formula 12]

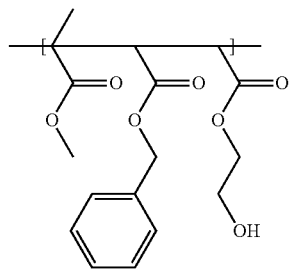

Preparation of Resist Underlayer Composition

Examples 1 to 9 and Comparative Example 1

Example 1

The polymer prepared in Synthesis Example 1 and pyridinium p-toluene sulfonate (1 part by weight relative to 100 parts by weight of the polymer) were dissolved in a mixed solvent of propylene glycol monomethylether and ethyl lactate (in a weight ratio=1:1) and then, stirred for 6 hours to prepare a resist underlayer composition.

The mixed solvent was used in an amount such that a solid content of the composition was 1 wt %, based on a total weight of the resist underlayer composition.

Examples 2 to 9

Each resist underlayer composition was prepared according to the same method as Example 1 by respectively using the polymers according to Synthesis Examples 2 to 8.

Comparative Example 1

A resist underlayer composition was prepared by dissolving the polymer according to Comparative Synthesis Example 1, PD1174 (hardener made by TCI, 15 parts by weight relative to 100 parts by weight of a polymer), and pyridinium p-toluene sulfonate (1 part by weight relative to 100 parts by weight of the polymer) were dissolved in a mixed solvent of propylene glycol monomethylether and ethyl lactate (weight ratio=1:1) and then, stirred for 6 hours.

The mixed solvent was used in an amount such that a solid content of the composition was 1 wt %, based on a total weight of the resist underlayer composition.

Evaluation of Sublimable Gas Generation

The compositions according to Examples 1 to 8 and Comparative Example 1 were respectively taken by 2 mL, applied on a 4 inch wafer, and spin-coated at 1,500 rpm for 20 seconds by using a spin coater (Mikasa Co., Ltd.). Subsequently, the compositions were respectively cured at 210° C. for 90 seconds to measure an amount of sublimable gas generated therefrom by using QCM equipment. The amounts of the generated sublimable gas respectively therefrom were shown in Table 1.

Synthesis Example 9

2,4-diallyloxy-6-methoxymethoxy-1,3,5-triazine (112.4 g), 2,3-dimercaptosuccinic acid (72.9 g), AIBN (1.31 g), and dimethyl formamide (123 g) were put in a 500 ml 2-necked round flask, and a condenser was connected thereto. The obtained mixture was heated up to 80° C. and reacted for 2.5 hours, and the reaction solution was cooled down to ambient temperature. Subsequently, the reaction solution was moved to a 1 L wide mouth bottle, washed three times with hexane, and subsequently, washed with purified water. Then, a resin in a gum state obtained therefrom was completely dissolved in 80 g of THF and slowly added in a dropwise fashion 700 g of toluene, while stirred. After pouring away a solvent therefrom, a solvent still remaining there was removed with a vacuum pump to obtain a polymer including a structural unit represented by Chemical Formula 11 (Mw=4,000).

[Chemical Formula 11]

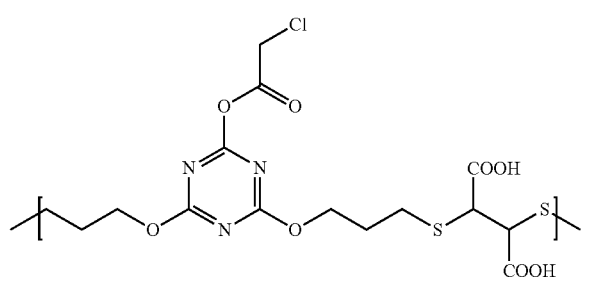

Comparative Synthesis Example

Methyl methacrylate (40 g), 2-hydroxyacrylate (52.1 g), benzyl acrylate (70.4 g), AIBN (2 g), and dioxane (306 g) were put in a 500 ml 2-necked round flask, and a condenser was connected thereto. The obtained mixture was heated up to 80° C. and reacted for 2.5 hours, and the reaction solution was cooled down to ambient temperature. Subsequently, the reaction solution was moved to a 1 L wide mouth bottle and then, washed with hexane. Then, a resin obtained therefrom was dried in a 30° C. vacuum oven to remove a solvent remaining there to obtain a polymer including a structural unit represented by Chemical Formula 12 (Mw=12,000).

TABLE 1

|  | Amount of sublimable gas (ng) |
|---|---|
| Example 1 | 1.76 |
| Example 2 | 2.21 |
| Example 3 | 1.56 |

TABLE 1-continued

| | Amount of sublimable gas (ng) |
|---|---|
| Example 4 | 1.67 |
| Example 5 | 2.05 |
| Example 6 | 1.98 |
| Example 7 | 1.55 |
| Example 8 | 2.11 |
| Example 9 | 2.01 |
| Comparative Example 1 | 4.34 |

As may be seen in Table 1, the Examples remarkably generated low sublimable gas, as compared with the Comparative Example.

By way of summation and review, the exposure of a photoresist may be performed by using an activated radiation, which is often reflected and thus restricts resolution of an image patterned in the photoresist layer, e.g., when the radiation is reflected on the interface between the substrate and the photoresist layer or on an interlayer hardmask is scattered into a photoresist region, a photoresist line width could become non-uniform and pattern-forming capability could be obstructed.

In addition, a photoresist underlayer composition may absorb the reflected radiation and simultaneously, may have high etch selectivity with the photoresist and chemical resistance against a solvent in a subsequent process after thermal curing and excellent adherence to the photoresist to help patterning the photoresist.

In order to decrease the reflected radiation, an attempt to absorb light passing the photoresist and simultaneously improve etch selectivity, chemical resistance, and adherence to the photoresist may be achieved by disposing an organic layer, e.g., a so-called resist underlayer between a substrate and a photoresist layer.

For example, as a semiconductor pattern gradually becomes fine, use of an activated radiation used for an exposure of a photoresist is widened up to a short wavelength such as i-line (365 nm), a KrF excimer laser (wavelength of 248 nm), an ArF excimer laser (wavelength of 193 nm), and the like, and accordingly, a resist underlayer applicable to a patterning process for forming an ultra-fine pattern of about 10 nm by using an EUV (Extreme Ultraviolet) light source may be considered.

The embodiments may provide a resist underlayer composition having improved coating uniformity and capable of decreasing defects.

<Description of Symbols>

100: substrate
102: thin layer
104: resist underlayer
106: photoresist layer
108: photoresist pattern
112: organic layer pattern
114: thin layer pattern Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A resist underlayer composition, comprising:
   a solvent; and
   a polymer that includes a structural unit represented by Chemical Formula 1 and a structural unit represented by Chemical Formula 2,

[Chemical Formula 1]

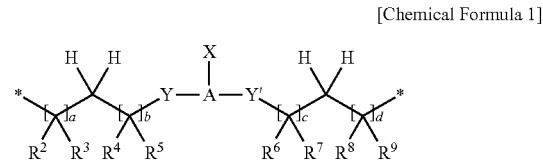

wherein, in Chemical Formula 1,

A is a substituted or unsubstituted C1 to C30 alkylene group, a substituted or unsubstituted C1 to C30 heteroalkylene group, a substituted or unsubstituted C3 to C30 cyclo alkylene group, a substituted or unsubstituted C2 to C30 heterocyclo alkylene group, a substituted or unsubstituted C6 to C30 arylene group, a substituted or unsubstituted C2 to C30 heteroarylene group, or a combination thereof, X is a group including an electrophile having, at a terminal end thereof, an epoxy group, a C1 to C6 alkoxy group, R—(C=O)—, in which R is hydrogen or a C1 to C10 alkyl group, R'O—(C=O)—, in which R' is a C1 to C10 alkyl group, or a halogen, Y and Y' are each independently a single bond, oxygen, carbonyl, —(CH$_2$)O—, —(CH$_2$)S—, —(CH$_2$)NH—, or a combination thereof, $R^2$ to $R^9$ are independently hydrogen, a hydroxy group, a halogen, a substituted or unsubstituted C1 to C10 alkoxy group, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C1 to C30 heteroalkyl group, a substituted or unsubstituted C2 to C30 heteroaryl group, or a combination thereof, a, b, c, and d are independently an integer of 0 to 100, a sum of a and b being 1 to 99, and a sum of c and d being 1 to 99, and

* is a linking point,

[Chemical Formula 2]

wherein, in Chemical Formula 2, $R^1$ is a substituted or unsubstituted C1 to C30 alkylene group, a substituted or unsubstituted C1 to C30 heteroalkylene group, a substituted or unsubstituted C3 to C30 cycloalkylene group, a substituted or unsubstituted C6 to C30 arylene group, a substituted or unsubstituted C2 to C30 heteroarylene group, —(($C_mH_{2m}$)O)$_n$—, in which m and n are each independently an integer of 1 to 10, or a combination thereof, E is a group including a nucleophile, and
* is a linking point.

2. The resist underlayer composition as claimed in claim 1, wherein in Chemical Formula 2, the moiety

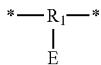

is a moiety represented by Chemical Formula 2-I:

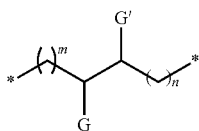

[Chemical Formula 2-I]

wherein, in Chemical Formula 2-I,
G and G' are each independently a group including a nucleophile,
m and n are each independently an integer of 0 to 10, and
* is a linking point.

3. The resist underlayer composition as claimed in claim 2, wherein G and G' each independently include a hydroxy group (—OH), an amino group (—NH$_2$), a carboxyl group (—COOH), an amide group (—CONH$_2$), or a thiol group (—SH).

4. The resist underlayer composition as claimed in claim 1, wherein in Chemical Formula 1, A is a substituted or unsubstituted C1 to C30 heteroalkylene group, a substituted or unsubstituted C2 to C30 heterocycloalkylene group, a substituted or unsubstituted C2 to C30 heteroarylene group, or a combination thereof.

5. The resist underlayer composition as claimed in claim 4, wherein X of Chemical Formula 1 is bonded to at least one of a heteroatom or a carbon atom of A.

6. The resist underlayer composition as claimed in claim 1, wherein the moiety

of Chemical Formula 1 is a moiety represented by one of Chemical Formulae 1-a to 1-c:

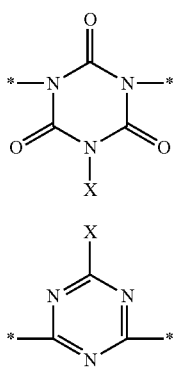

[Chemical Formula 1-a]

[Chemical Formula 1-b]

[Chemical Formula 1-c]

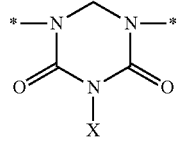

wherein, in Chemical Formulae 1-a to 1-c, X is defined the same as X of Chemical Formula 1.

7. The resist underlayer composition as claimed in claim 1, wherein X is a group represented by Chemical Formula 1-II:

[Chemical Formula 1-II]

wherein, in Chemical Formula 1-II,
o, p, and q are each independently an integer of 0 to 10,
Q is —O—, —S—, —(C=O)—, —(C=O)O—, —CH$_2$NH—, —CONH—, —NH—, or —(SO$_2$)—, and
R$^a$ is a group including an electrophile having an epoxy group, a C1 to C6 alkoxy group, R—(C=O)—, in which R is hydrogen or a C1 to C10 alkyl group, R'O—(C=O)—, in which R' is hydrogen or a C1 to C10 alkyl group, or a halogen.

8. The resist underlayer composition as claimed in claim 1, wherein E includes a hydroxy group (—OH), an amino group (—NH$_2$), a carboxyl group (—COOH), an amide group (—CONH$_2$), or a thiol group (—SH).

9. The resist underlayer composition as claimed in claim 1, wherein the polymer includes a structural unit represented by one of Chemical Formula 3 to Chemical Formula 11:

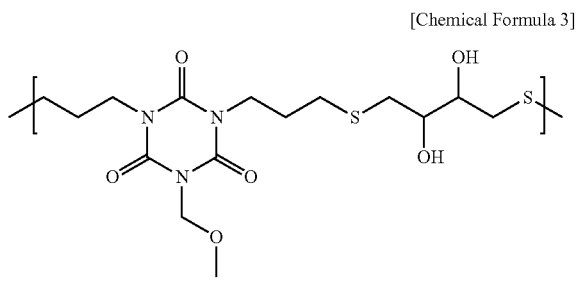

[Chemical Formula 3]

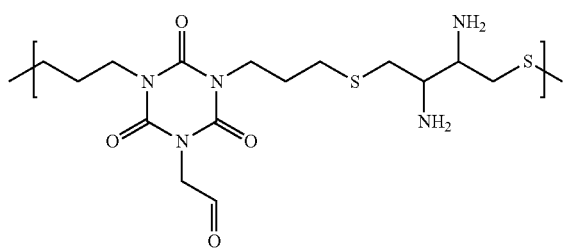

[Chemical Formula 4]

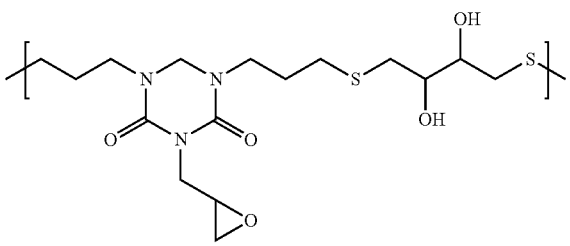

[Chemical Formula 5]

-continued

[Chemical Formula 6]

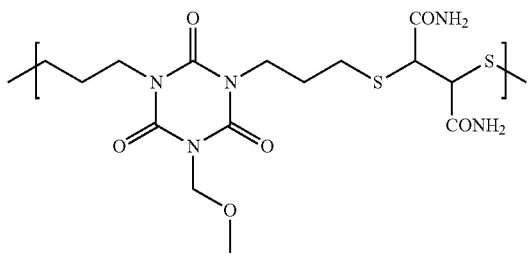

[Chemical Formula 7]

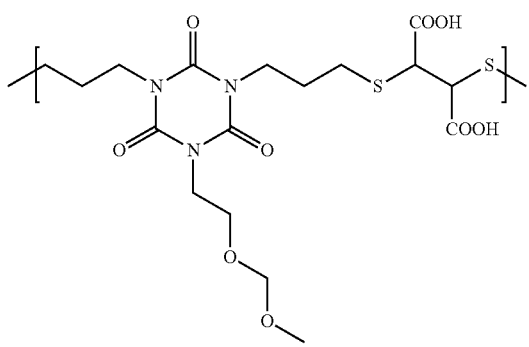

[Chemical Formula 8]

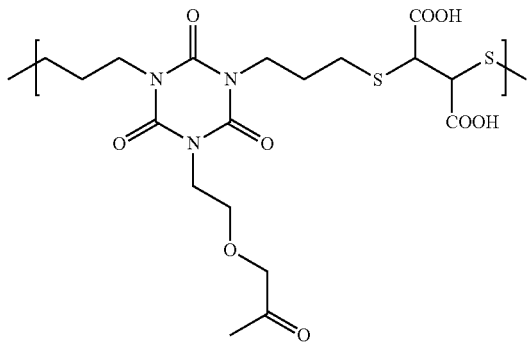

[Chemical Formula 9]

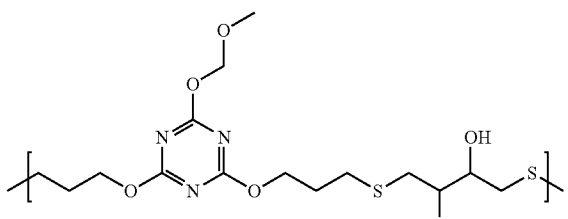

[Chemical Formula 10]

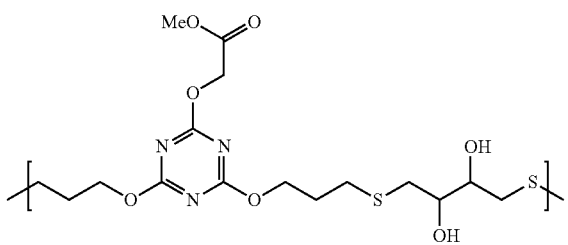

-continued

[Chemical Formula 11]

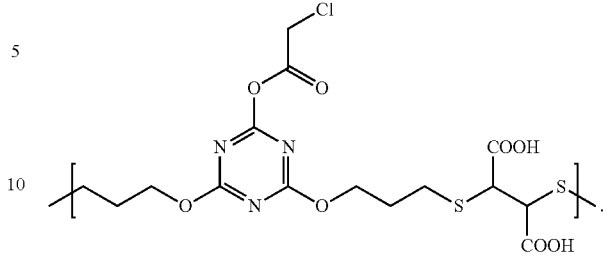

10. The resist underlayer composition as claimed in claim 1, wherein the polymer has a weight average molecular weight of about 1,000 to about 100,000.

11. The resist underlayer composition as claimed in claim 1, wherein the polymer is included in an amount of about 0.1 wt % to about 50 wt %, based on a total weight of the resist underlayer composition.

12. The resist underlayer composition as claimed in claim 1, further comprising an acryl resin, an epoxy resin, a novolac resin, a glycoluril resin, or a melamine resin.

13. The resist underlayer composition as claimed in claim 1, further comprising a surfactant, a thermal acid generator, a plasticizer, or a combination thereof.

14. A method of forming patterns, the method comprising:
    forming an etching subject layer on a substrate,
    coating the resist underlayer composition as claimed in claim 1 on the etching subject layer to form a resist underlayer,
    forming a photoresist pattern on the resist underlayer, and
    sequentially etching the resist underlayer and the etching subject layer using the photoresist pattern as an etching mask.

15. The method as claimed in claim 14, wherein forming the photoresist pattern includes:
    forming a photoresist layer on the resist underlayer,
    exposing the photoresist layer, and
    developing the photoresist layer.

16. The method as claimed in claim 14, wherein forming the resist underlayer further includes heat-treating the coated resist underlayer composition at a temperature of about 100° C. to about 500° C.

17. A resist underlayer composition, comprising:
    a solvent; and
    a polymer that includes a structural unit represented by Chemical Formula 1 and a structural unit represented by Chemical Formula 2,

[Chemical Formula 1]

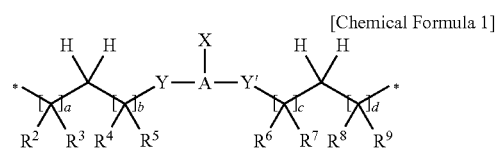

wherein, in Chemical Formula 1,
A is a substituted or unsubstituted C1 to C30 alkylene group, a substituted or unsubstituted C1 to C30 heteroalkylene group, a substituted or unsubstituted C3 to C30 cyclo alkylene group, a substituted or unsubstituted C2 to C30 heterocyclo alkylene group, a substituted or unsubstituted C6 to C30 arylene group, a substituted or unsubstituted C2 to C30 heteroarylene group, or a combination thereof, X is a group including an electrophile, Y and Y' are each independently a single bond, oxygen, carbonyl, —($CH_2$)O—, —($CH_2$)S—, —($CH_2$)NH—, or a combination thereof, $R^2$ to $R^9$ are independently hydrogen, a hydroxy group, a halogen, a substituted or unsubstituted C1 to C10 alkoxy group, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C1 to C30 heteroalkyl group, a substituted or unsubstituted C2 to C30 heteroaryl group, or a combination thereof, a, b, c, and d are independently an integer of 0 to 100, a sum of a and b being 1 to 99, and a sum of c and d being 1 to 99, and is a linking point,

[Chemical Formula 2]

wherein, in Chemical Formula 2, $R^1$ is a substituted or unsubstituted C1 to C30 alkylene group, a substituted or unsubstituted C1 to C30 heteroalkylene group, a substituted or unsubstituted C3 to C30 cycloalkylene group, a substituted or unsubstituted C6 to C30 arylene group, a substituted or unsubstituted C2 to C30 heteroarylene group, —(($C_mH_{2m}$)O)$_n$—, in which m and n are each independently an integer of 1 to 10, or a combination thereof, E includes an amino group (—$NH_2$), a carboxyl group (—COOH), an amide group (—$CONH_2$), or a thiol group (—SH), and is a linking point.

* * * * *